United States Patent
Lee

(10) Patent No.: US 7,158,066 B2
(45) Date of Patent: Jan. 2, 2007

(54) PIPELINED ANALOG-TO-DIGITAL CONVERTER HAVING ENHANCED HIGH FREQUENCY PERFORMANCE CHARACTERISTICS

(75) Inventor: Jin-kug Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/247,748

(22) Filed: Oct. 11, 2005

(65) Prior Publication Data

US 2006/0145908 A1    Jul. 6, 2006

(30) Foreign Application Priority Data

Dec. 30, 2004   (KR) .................. 10-2004-0116997

(51) Int. Cl.
   *H03M 1/66* (2006.01)
(52) U.S. Cl. ...................... 341/144; 341/155
(58) Field of Classification Search ............. 341/144, 341/155, 161
   See application file for complete search history.

(56) References Cited

U.S. PATENT DOCUMENTS 4,994,808 A    2/1991  Wichelman 5,936,461 A *  8/1999  Nagazumi ................ 327/552
6,323,800 B1* 11/2001  Chiang .................... 341/161
6,369,744 B1*  4/2002  Chuang .................... 341/161
6,437,722 B1*  8/2002  Yoshizawa ................ 341/154

FOREIGN PATENT DOCUMENTS

| JP | 2000-022541 | 2/2000 |
| JP | 2001-168713 | 6/2001 |
| KR | 1019970005828 B1 | 4/1997 |

* cited by examiner

*Primary Examiner*—Peguy JeanPierre
(74) *Attorney, Agent, or Firm*—Myers Bigel Sibley & Sajovec PA

(57) ABSTRACT

A pipelined digital-to-analog converter includes a first sub analog-to-digital converter and a multiplying digital-to-analog converter. The first sub analog-to-digital converter, which is responsive to a first reference voltage, is configured to convert a first analog signal into a first digital signal. The multiplying digital-to-analog converter is responsive to the first analog signal, the first digital signal and a second reference voltage. The second reference voltage is generated independently of the first reference voltage in order to enhance the high frequency performance characteristics of the pipelined digital-to-analog converter.

14 Claims, 6 Drawing Sheets

PIPELINED ANALOG-TO-DIGITAL CONVERTER HAVING ENHANCED HIGH FREQUENCY PERFORMANCE CHARACTERISTICS

REFERENCE TO PRIORITY APPLICATION

This application claims priority to Korean Patent Application No. 2004-116997, filed Dec. 30, 2004, the disclosure of which is hereby incorporated herein by reference.

FIELD OF THE INVENTION

The present invention relates to integrated circuit devices and, more particularly, to analog-to-digital converters.

BACKGROUND OF THE INVENTION

An analog-digital converting device converts an analog signal into a digital signal, and a pipelined analog-digital converting device is formed of a plurality of such analog-digital converting devices connected to one another. FIG. 1 is a block diagram of a conventional pipelined analog-digital converting device 101. Referring to FIG. 1, the conventional pipelined analog-digital converting device 101 includes first through $n^{th}$ sub analog-digital converters 111a through 111n, first through $n^{th}$ multiplying digital to analog converters (MDACs) 121a through 121n, and a sample/hold amplifier 131. All of the first through $n^{th}$ sub analog-digital converters 111a through 111n, which may be flash analog-digital converters, and the first through $n^{th}$ MDACs 121a through 121n, use one reference voltage Vref. In other words, the first through $n^{th}$ sub analog-digital converters 111a through 111n, and the first through $n^{th}$ MDACs 121a through 121n receive the reference voltage Vref supplied by a reference voltage generator (not shown).

FIG. 2 illustrates waveforms of signals transmitted to the pipelined analog-digital converting device 101 of FIG. 1 and consequent operations of some elements of the pipelined analog-digital converting device 101. In FIG. 2, S.S, S.H, R.S, S.C, and S.A are abbreviations for signal sampling, signal holding, reference sampling, signal comparing, and signal amplifying, respectively. Referring to FIG. 2, while a clock signal CK is at a high level (tk1), the first sub analog-digital converter 111a samples an analog signal A1 output from the sample/hold amplifier 131 of FIG. 1. At this time, the first MDAC 121a of FIG. 1 samples the reference voltage Vref. While the clock signal CK is at the high level (tk1), the first sub analog-digital converter 111a samples the reference voltage Vref and the first MDAC 121a amplifies the analog signal A1.

When the reference voltage Vref is applied to the pipelined analog-digital converting device 101, the reference voltage Vref is stabilized at a constant level after some fluctuations during each clock cycle. When the operating frequency of the pipelined analog-digital converting device 101 is high, all operations are performed while the reference voltage Vref fluctuates. Such fluctuations of the reference voltage Vref may cause errors in the first through $n^{th}$ MDACs 121a through 121n, whose precision is required. To prevent such errors, the operating frequency of the pipelined analog-digital converting device 101 can be lowered.

In order to use a reference voltage that does not fluctuate, at a high operating frequency, a large capacity reference voltage generator may be used, resulting in an increase in the size of the reference voltage generator and high manufacturing costs. The reference voltage generator may be connected to a large external capacitor through a pin at the analog-digital converting device 101 and the reference voltage Vref generated by the reference voltage generator may be supplied to the capacitor. However, in this case, a dedicated pin is additionally required.

SUMMARY OF THE INVENTION

The present invention provides a pipelined analog-digital converting device that operates stably by reducing the fluctuations of a reference voltage. According to an aspect of the present invention, there is provided a pipelined analog-digital converting device including a first node to which a first reference voltage is applied, and a second node to which a second reference voltage is applied. At least one sub analog-digital converter, which is connected to the first node, receives an analog signal, converts the analog signal using the first reference voltage, and outputs a digital signal. At least one multiplying digital-analog converter, which is connected to the second node, receives a digital signal output from a corresponding sub analog-digital converter and an analog signal input to the corresponding sub analog-digital converter, converts the digital signal output from the corresponding sub analog-digital converter into an analog signal using the second reference voltage, compares the generated analog signal with the analog signal input to the corresponding sub analog-digital converter, and amplifies and outputs the difference between the analog signals. A last sub analog-digital converter, which is connected to the second node, receives an analog signal output from a corresponding multiplying digital-analog converter, converts the analog signal using the second reference voltage, and outputs a digital signal.

A first sub analog-digital converter of the at least one sub analog-digital converter may output a most significant bit of a digital signal output from the pipelined analog-digital converting device and the last sub analog-digital converter may output a least significant bit of the digital signal output from the pipelined analog-digital converting device. The device may further include a corrector correcting a digital signal generated by the at least sub analog-digital converter.

Each of the at least one multiplying digital-analog converter may include a sub digital-analog converter receiving a digital signal output from a corresponding sub analog-digital converter, converting the digital signal into an analog signal, and outputting the analog signal. A comparator is also configured to receive the analog signal output from the sub digital-analog converter and an analog signal input to the corresponding sub analog-digital converter. The comparator compares these analog signals, and outputs the difference between the analog signals. An amplifier is provided for amplifying and outputting the output of the comparator.

The device may further include a sample/hold amplifier, which transmits an analog signal to the first sub analog-digital converter of the at least one sub analog-digital converter, and a first multiplying digital-analog converter of the at least one multiplying digital-analog converter. At least one clock signal may be input to the at least one sub analog-digital converter and the at least one multiplying digital-analog converter.

DETAILED DESCRIPTION OF THE INVENTION

Figure 1:
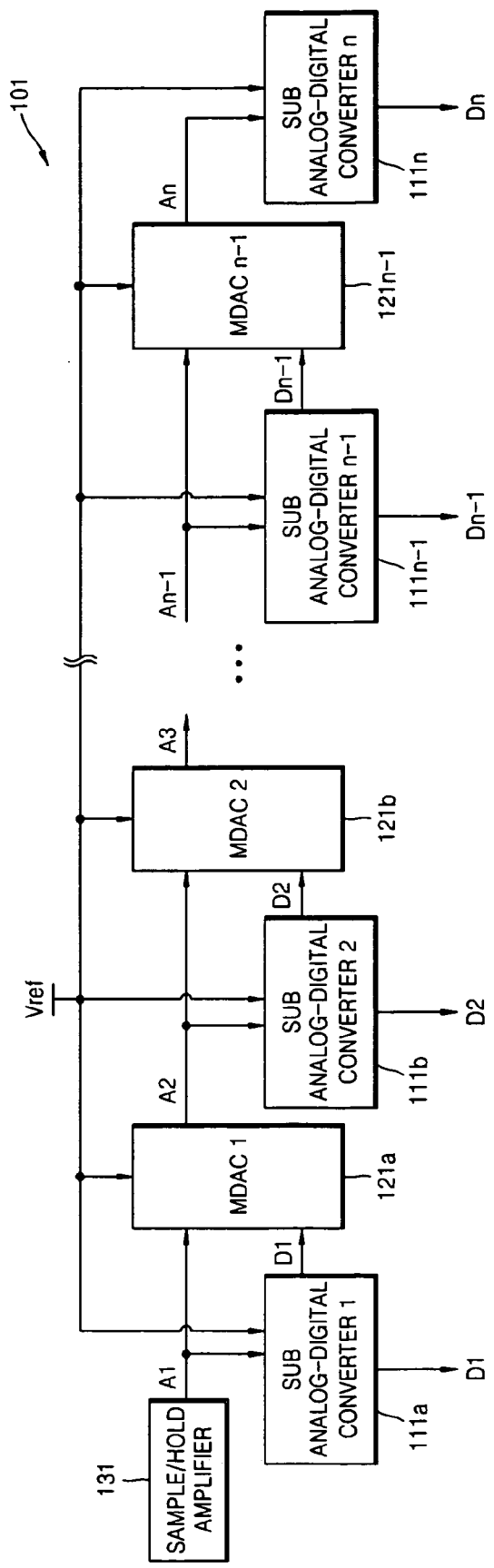
FIG. 1 is a block diagram of a conventional pipelined analog-digital converting device.
Figure 2:
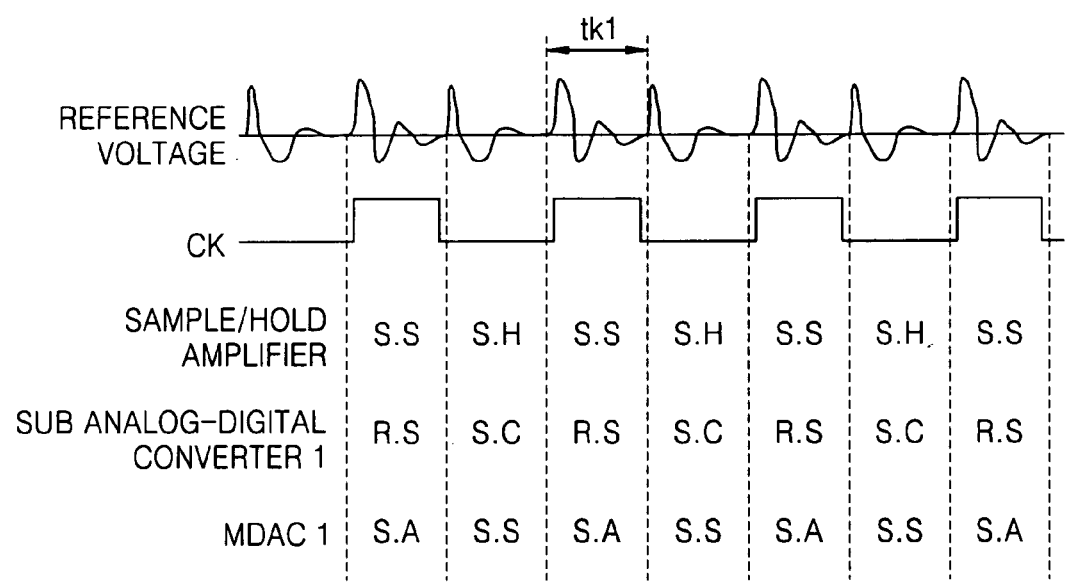
FIG. 2 illustrates waveforms of signals transmitted to the pipelined analog-digital converting device of FIG. 1 and operations of some elements of the pipelined analog-digital converting device.

The present invention will now be described more fully with reference to the accompanying drawings, in which exemplary embodiments of the invention are shown. The invention may, however, be embodied in many different forms and should not be construed as being limited to the embodiments set forth therein; rather, these embodiments are provided so that this disclosure will be thorough and complete, and will fully convey the concept of the invention to those skilled in the art. Like reference numerals in the drawings denote like elements.

Figure 3:
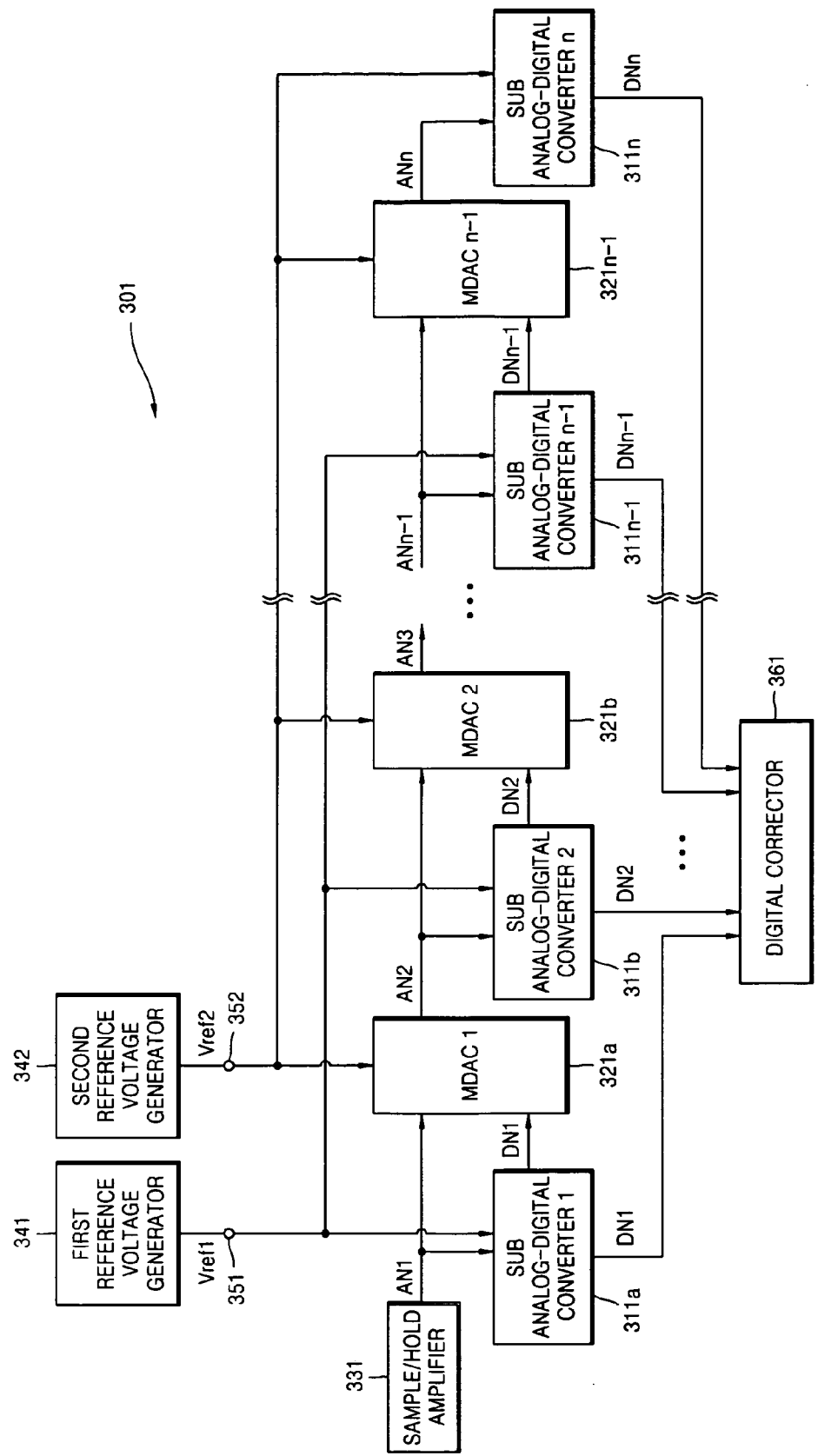
FIG. 3 is a block diagram of a pipelined analog-digital converting device according to an embodiment of the present invention.

FIG. 3 is a block diagram of a pipelined analog-digital converting device 301 according to an embodiment of the present invention. Referring to FIG. 3, the pipelined analog-digital converting device 301 includes a sample/hold amplifier 331, a first reference voltage generator 341, a second reference voltage generator 342, first and second nodes 351 and 352, first through $n^{th}$ sub analog-digital converters 311a through 311n, first through $(n-1)^{th}$ multiplying digital to analog converters (MDACs) 321a through 321n-1, and a digital corrector 361.

The sample/hold amplifier 331 repeatedly samples and holds an analog signal input from an external source at regular intervals and outputs an analog signal AN1. The first reference voltage generator 341 generates a first reference voltage Vref1, and the second reference voltage generator 342 generates a second reference voltage Vref2. The first reference voltage Vref1 and the second reference voltage Vref2 may be set at equal or different magnitudes. However, the second reference voltage generator 342 may be more precise than the first reference voltage generator 341.

The first and second nodes 351 and 352 are connected to the first and second reference voltage generators 341 and 342, respectively. The first and second nodes 351 and 352 are needed to externally connect the first and second reference voltage generators 341 and 342 to the pipelined analog-digital converting device 301. When the first and second reference voltage generators 341 and 342 are installed within the pipelined analog-digital converting device 301, the first and second nodes 351 and 352 are not needed.

The first through $(n-1)^{th}$ sub analog-digital converters 311a through 311n-1 are connected to the first node 351 and receive the first reference voltage Vref1 generated by the first reference voltage generator 341. The first through $(n-1)^{th}$ sub analog-digital converters 311a through 311n-1 respectively receive first through $(n-1)^{th}$ analog signals AN1 through ANn-1, convert the first through $(n-1)^{th}$ analog signals AN1 through ANn-1 using the first reference voltage Vref1, and output first though $(n-1)^{th}$ digital signals DN1 through DNn-1.

The $n^{th}$ sub digital-analog converter 311n receives an $n^{th}$ analog signal ANn output from the $(n-1)^{th}$ MDAC 321n-1, converts the $n^{th}$ analog signal ANn using the second reference voltage Vref2, and outputs the $n^{th}$ digital signal DNn. The first sub analog-digital converter 311a receives the first analog signal AN1 output from the sample/hold amplifier 331. The second through $n^{th}$ sub analog-digital converters 311b through 311n receive the second through $n^{th}$ analog signals AN2 through ANn output from the first through $(n-1)^{th}$ MDACs 321a through 321n-1. All of the first through $n^{th}$ sub analog-digital converter 311a through 311n may be flash analog-digital converters.

The first through $(n-1)^{th}$ MDACs 321a through 321n-1 are connected to the second node 352 and receive the second reference voltage Vref2 generated by the second reference voltage generator 342. The first through $(n-1)^{th}$ MDACs 321a through 321n-1 receive digital signals output from the first through $(n-1)^{th}$ sub analog-digital converters 311a through 311n-1 and the first through $(n-1)^{th}$ analog signals DN1 through DNn-1.

The first through $(n-1)^{th}$ MDACs 321a through 321n-1 respectively convert the digital signals output from the first through $(n-1)^{th}$ sub analog-digital converters 311a through 311n-1 into the second through $n^{th}$ analog signals AN2 through ANn, compare the second through $n^{th}$ analog signals AN2 through ANn with the first through $(n-1)^{th}$ analog signals AN1 through ANn-1, and amplify and output the differences between the compared analog signals.

At this time, the first MDAC 321a receives the first analog signal AN1 output from the sample/hold amplifier 331. The configurations of the first through $(n-1)^{th}$ MDACs 321a through 321n-1 will be described later in detail with reference to FIG. 4.

The digital corrector 361 corrects the first through $(n-1)^{th}$ digital signals DN1 through DNn-1 output from the first through $(n-1)^{th}$ sub analog-digital converters. In other words, since errors may be contained in the first through $(n-1)^{th}$ digital signals DN1 through DNn-1 output from the first through $(n-1)^{th}$ sub analog-digital converters, the digital corrector 361 corrects such errors. However, the digital corrector 361 does not correct the $n^{th}$ digital signal output from the $n^{th}$ sub analog-digital converter 311n. Therefore, the $n^{th}$ sub analog-digital converter 311n is designed with precision to prevent errors.

Figure 4:
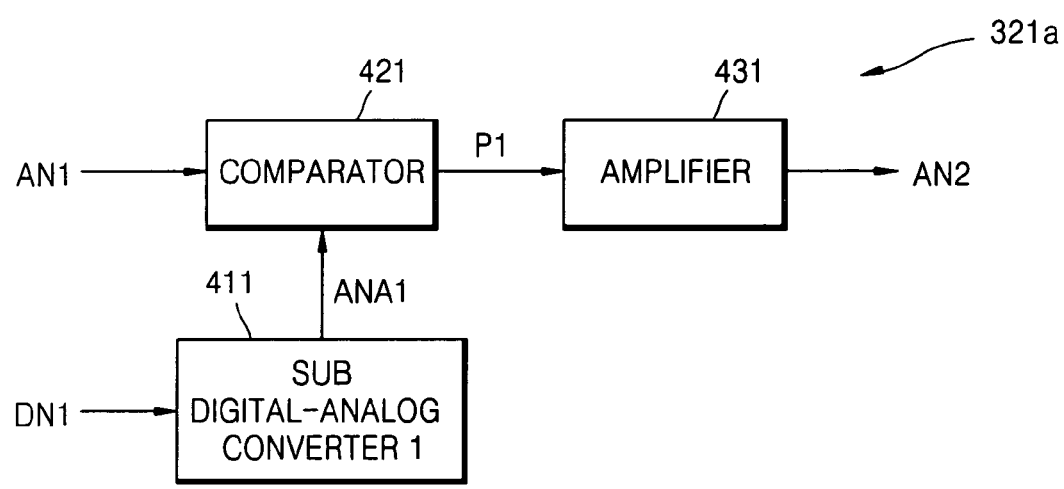
FIG. 4 is a detailed block diagram of a first MDAC illustrated in FIG. 3.

FIG. 4 is a detailed block diagram of the first MDAC 321a illustrated in FIG. 3. Referring to FIG. 4, the first MDAC 321a includes a first sub digital-analog converter 411, a comparator 421, and an amplifier 431. The first sub digital-analog converter 411 receives the first digital signal DN1 output from the first sub analog-digital converter 311a of FIG. 3, converts the first digital signal DN1 into a first analog signal ANA1, and outputs the first analog signal ANA1. The comparator 421 receives the first analog signal ANA1 output from the first sub digital-analog converter 411 and the first analog signal AN1 input to the first sub analog-digital converter 311a of FIG. 1, compares the first analog signal ANA1 with the first analog signal AN1, and outputs the difference between them. The amplifier 431 amplifies the signal output from the comparator 421 and outputs the second analog signal AN2 as an output signal of the first MDAC 321a. The configurations of the second through $(n-1)^{th}$ DMACs 321b through 321n-1 are identical to that of the first MDAC 321a.

Figure 5:
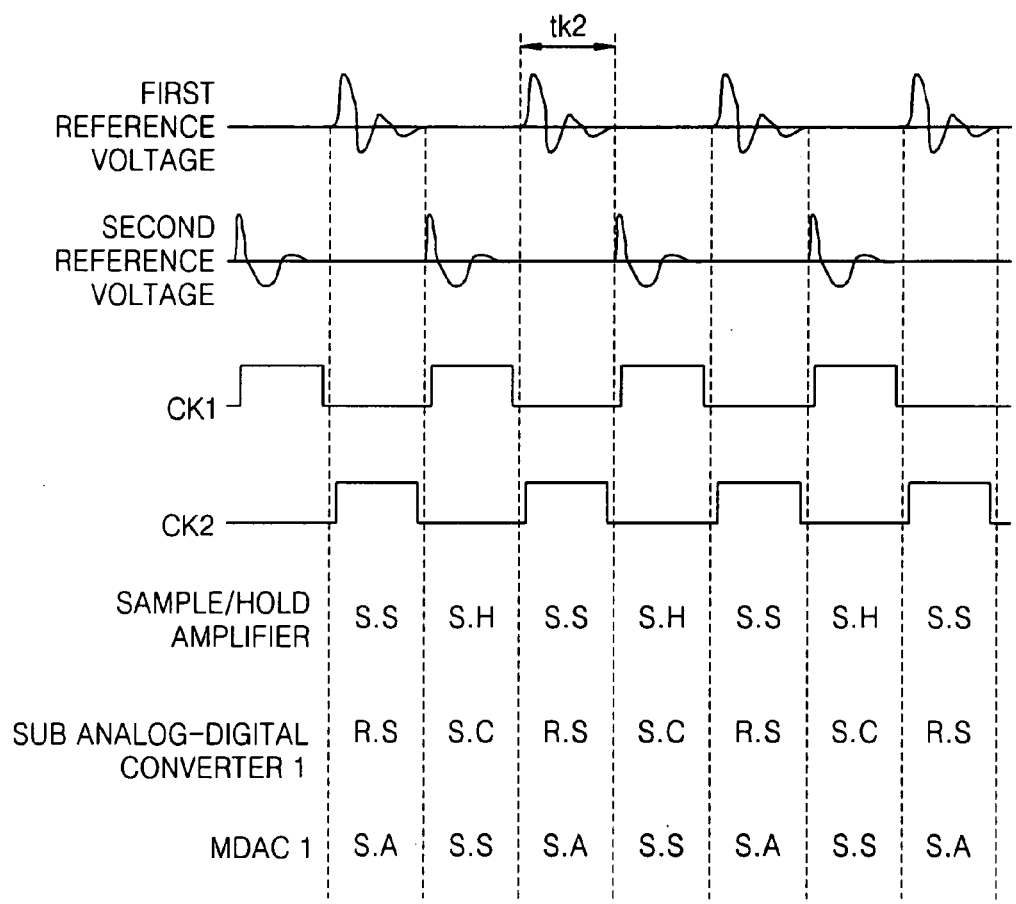
FIG. 5 illustrates waveforms of signals transmitted to the pipelined analog-digital converting device of FIG. 3 and operations of some elements of the pipelined analog-digital converting device.

FIG. 5 illustrates waveforms of signals transmitted to the pipelined analog-digital converting device 301 of FIG. 3 and consequent operations of some elements of the pipelined analog-digital converting device 301. In FIG. 5, S.S, S.H, R.S, S.C, and S.A are abbreviations for signal sampling, signal holding, reference sampling, signal comparing, and signal amplifying, respectively. Referring to FIGS. 3 and 5, clock signals CK1 and CK2 are transmitted to the first through $n^{th}$ sub analog-digital converters 311a through 311n of FIG. 3 and the first through $(n-1)^{th}$ MDACs 321a through 321n-1.

While clock signal CK2 is at a high level (tk2), the first sub analog-digital converter 311a of FIG. 3 samples the first analog signal A1 output from the sample/hold amplifier 331 of FIG. 3. At this time, the first MDAC 321a of FIG. 3 samples the first reference voltage Vref1 of FIG. 3. While the clock signal CK2 is at the high level (tk2), the first sub analog-digital converter 311a samples the first reference voltage Vref1 and the first MDAC 321a of FIG. 3 amplifies the first analog signal A1.

During tk2, the second reference voltage Vref2 of FIG. 3 applied to the first MDAC 321a of FIG. 3 is maintained constant without fluctuations. Thus, the first MDAC 321a of FIG. 3 can stably perform an amplifying operation. Also, the second through (n-1)th MDACs 321b through 321n-1 can stably perform the amplifying operations using the constant second reference voltage Vref2 of FIG. 3.

Since the second reference voltage Vref2 applied to the first through $(n-1)^{th}$ MDACs 321a through 321n-1 is different from the first reference voltage applied to the first through $(n-1)^{th}$ sub analog-digital converters 311a through 311n-1, the pipelined analog-digital converting device 301 of FIG. 3 can stably perform a converting operation.

Figure 6:
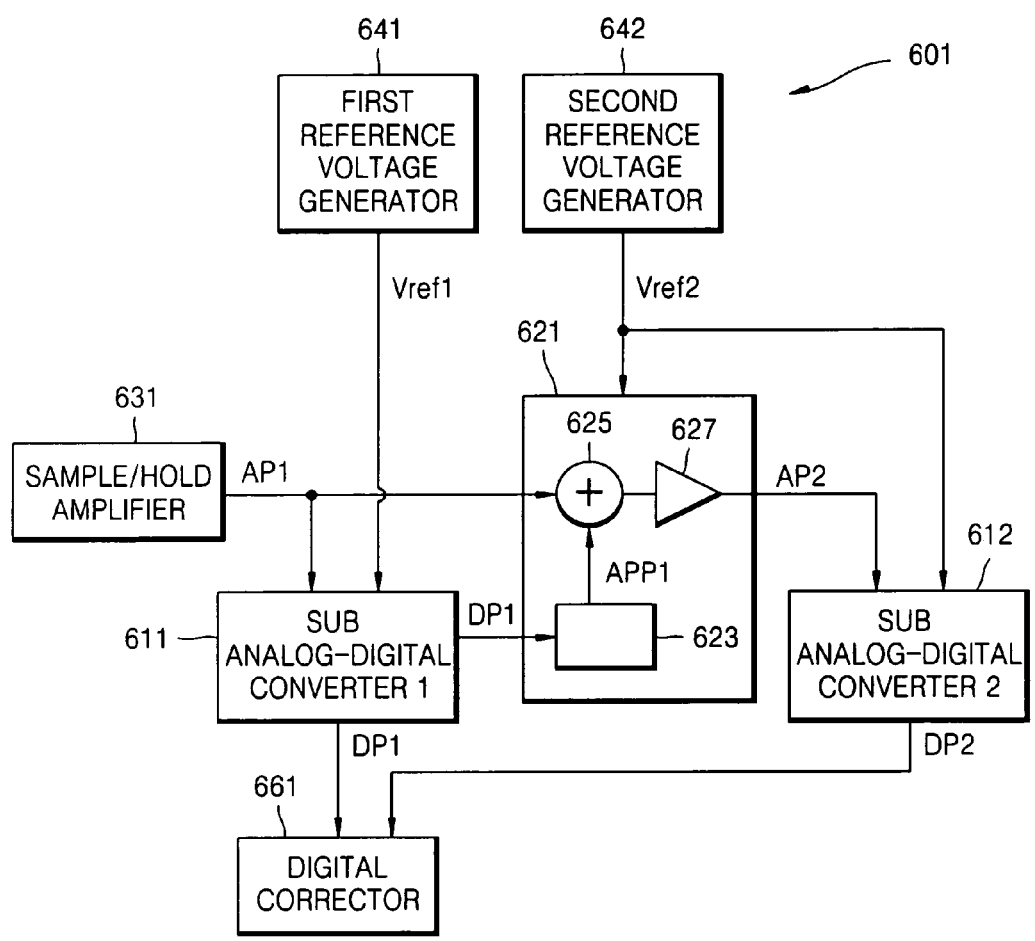
FIG. 6 is a block diagram of a 4-bit pipelined analog-digital converting device.

FIG. 6 is a block diagram of a 4-bit pipelined analog-digital converting device 601 according to an embodiment of the present invention. Referring to FIG. 6, the 4-bit pipelined analog-digital converting device 601 includes a sample/hold amplifier 631, a first reference voltage generator 641, a second reference voltage generator 642, first and second sub analog-digital converters 611 and 612, an MDAC 621, and a digital corrector 661.

The converting operation of the 4-bit pipelined analog-digital converting device 601 will now be described with reference to FIG. 6. It is assumed that 0.84[V] is output from the sample/hold amplifier 631 and the voltage level of an analog signal AP1 output from the sample/hold amplifier 631 is between 0[V] and 1[V].

The 0.84[V] output from the sample/hold amplifier 631 is converted into binary code by the first sub analog-digital converter 611. As shown in Table 1 below, the first and second sub analog-digital converters 611 and 612 classify one volt into four 0.25-volt phases. The first and second sub analog-digital converters 611 and 612 sample voltages of the input analog signals AP1 and AP2 and determine to which the sampled voltages of the analog signals AP1 and AP2 belong.

TABLE 1

| Voltage Level (Volt) | Binary Code |
|---|---|
| 0~0.25 | 00 |
| 0.25~0.5 | 01 |
| 0.5~0.75 | 10 |
| 0.75~1.0 | 11 |

As shown in Table 1, since 0.84 volt is between 0.75 and 1.0 volt, the first sub analog-digital converter 611 outputs "11."

The binary code "11", i.e. a digital signal, output from the first sub analog-digital converter 611 is transmitted to a sub digital-analog converter 623 included in the MDAC 621. The sub digital-analog converter 623 converts "11" into an analog signal APP1. In other words, since "11" indicates a voltage between 0.75V and 1V, the sub digital-analog converter 623 outputs a 0.75V analog signal APP1.

A comparator 625 included in the MDAC 621 receives the analog signal AP1 output from the sample/hold amplifier 631 and the analog signal APP1 output from the sub digital-analog converter 623 and outputs a voltage equal to the difference between the analog signals AP1 and APP1. Specifically, the voltage of the analog signal AP1 output from the sample/hold amplifier 631 is 0.84V and the voltage of the analog signal APP1 output from the sub digital-analog converter 623 is 0.75V. Therefore, the difference between the analog signals AP1 and APP1 is 0.09V.

An amplifier included in the MDAC 621 amplifies and outputs a 0.09V analog signal output from the comparator 625. The amplifier 627 amplifies the 0.09V fourfold and outputs 0.36V.

The second sub analog-digital converter 612 receives and converts the 0.36V output from the MDAC 621 and outputs a digital signal "01." The digital corrector 661 corrects a digital signal DP1 output from the first sub analog-digital converter 611. The 4-bit pipelined analog-digital converting device 601 receives and converts the 0.84-volt analog signal into a digital signal "1101."

The 4-bit analog-digital converting device 601 may include three MDACs and four sub analog-digital converters. In this case, each of the MDACs generates a digital signal.

As described above, an analog-digital converting device according to the present invention receives different reference voltages from two reference voltage generators. Therefore, the analog-digital converting device has the following advantages.

First, MDACs operate stably since no time is required to receive stable reference voltages that do not fluctuate.

Second, since the MDACs operate stably, the operating frequency of the analog-digital converting device can be increased. Accordingly, the analog-digital converting device can be employed by a system in which high-speed operation is required.

Third, digital signals generated by sub analog-digital converters are corrected by a digital corrector. Thus, the sub analog-digital converters can receive reference voltages generated by a low-precision reference voltage generator, and the MDACs and the last sub analog-digital converter whose precision is required can receive a reference voltage generated by a high-precision reference voltage generator. Therefore, the precision of the analog-digital converting device is enhanced.

Fourth, since the digital signals generated by the sub analog-digital converters to which a first reference voltage is applied are corrected by the digital corrector, the analog-digital converting device is not affected by an offset between the first reference voltage and a second reference voltage.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A pipelined digital-to-analog converter, comprising:
   a first sub analog-to-digital converter configured to convert a first analog signal into a first digital signal and responsive to a first reference voltage;
   a multiplying digital-to-analog converter responsive to the first analog signal, the first digital signal and a second reference voltage generated independently of the first reference voltage; and
   a second sub analog-to-digital converter responsive to the second reference voltage.

2. The converter of claim 1, wherein the second sub analog-to-digital converter is a last sub analog-to-digital converter in the pipelined digital-to-analog converter.

3. The converter of claim 2, wherein the first digital signal represents a most significant bit of a multi-bit digital signal output from the pipelined digital-to-analog converter.

4. The converter of claim 3, wherein the last sub analog-to-digital converter is configured to generate a digital signal as a least significant bit of the multi-bit digital signal output from the pipelined digital-to-analog converter.

5. The converter of claim 4, wherein the first and second reference voltages are generated with different levels of voltage stability.

6. The converter of claim 5, wherein the second reference voltage is generated at a higher level of stability than the first reference voltage.

7. The converter of claim 6, wherein a magnitude of the first reference voltage equals a magnitude of the second reference voltage.

8. The converter of claim 1, wherein the first digital signal represents a most significant bit of a multi-bit digital signal output from the pipelined digital-to-analog converter.

9. A pipelined analog-digital converting device comprising:
   a first node to which a first reference voltage is applied;
   a second node to which a second reference voltage is applied;
   at least one sub analog-digital converter that is connected to the first node receives an analog signal, converts the analog signal using the first reference voltage, and outputs a digital signal;
   at least one multiplying digital-analog converter that is connected to the second node, receives a digital signal output from a corresponding sub analog-digital converter and an analog signal input to the corresponding sub analog-digital converter, converts the digital signal output from the corresponding sub analog-digital converter into an analog signal using the second reference voltage, compares the generated analog signal with the analog signal input to the corresponding sub analog-digital converter, and amplifies and outputs the difference between the analog signals; and
   a last sub analog-digital converter that is connected to the second node, receives an analog signal output from a corresponding multiplying digital-analog converter, converts the analog signal using the second reference voltage, and outputs a digital signal.

10. The device of claim 9, wherein a first sub analog-digital converter of the at least one sub analog-digital converter outputs a most significant bit of a digital signal output from the pipelined analog-digital converting device and the last sub analog-digital converter outputs a least significant bit of the digital signal output from the pipelined analog-digital converting device.

11. The device of claim 9, further comprising a corrector correcting a digital signal generated by the at least one sub analog-digital converter.

12. The device of claim 9, wherein each of the at least one multiplying digital-analog converter comprises:
   a sub digital-analog converter receiving a digital signal output from a corresponding sub analog-digital converter, converting the digital signal into an analog signal, and outputting the analog signal;
   a comparator receiving the analog signal output from the sub digital-analog converter and an analog signal input to the corresponding sub analog-digital converter, comparing the analog signals, and outputting the difference between the analog signals; and
   an amplifier amplifying and outputting the output of the comparator.

13. The device of claim 9, further comprising a sample/hold amplifier transmitting an analog signal to the first sub analog-digital converter of the at least one sub analog-digital converter and a first multiplying digital-analog converter of the at least one multiplying digital-analog converter.

14. The device of claim 9, wherein at least one clock signal is input to the at least one sub analog-digital converter and the at least one multiplying digital-analog converter.

* * * * *